United States Patent

Schittko

[11] 4,006,420
[45] Feb. 1, 1977

[54] CALIBRATABLE HETERODYNE RECEIVER

[75] Inventor: Johannes Schittko, Krailling, Germany

[73] Assignee: Siemens Aktiengesellschaft, Berlin & Munich, Germany

[22] Filed: July 5, 1973

[21] Appl. No.: 376,348

[30] Foreign Application Priority Data

July 7, 1972 Germany .................... 2233533

[52] U.S. Cl. ............................. 325/363; 324/130
[51] Int. Cl.² .......................................... H04B 1/26
[58] Field of Search ............ 324/78 R, 78 N, 79 R, 324/79 D, 130; 325/67, 363, 364, 455; 307/237

[56] References Cited

UNITED STATES PATENTS

| 3,012,197 | 12/1961 | Peterson et al. | 324/130 |
| 3,310,744 | 3/1967 | Miller | 325/363 |
| 3,486,112 | 12/1969 | Bayer | 325/363 |
| 3,524,995 | 8/1970 | Von Recklinghausen | 307/237 |

FOREIGN PATENTS OR APPLICATIONS 1,240,989  5/1967  Germany

Primary Examiner—Robert L. Richardson
Assistant Examiner—Marc E. Bookbinder
Attorney, Agent, or Firm—Hill, Gross, Simpson, Van Santen, Steadman, Chiara & Simpson

[57] ABSTRACT

A calibratable heterodyne receiver can be adjusted to a calibration mark or similar entity of an indicating device connected to the output of the receiver during feeding of a calibration alternating current with the help of adjusting means which change the gain of the amplifier. The calibration alternating current frequency is adapted during each calibration to the tuning frequency and is obtained by means of mixing the output voltage of the heterodyne oscillator with an auxiliary voltage which corresponds to the intermediate frequency. The auxiliary voltage is tapped from an intermediate frequency stage of the receiver and is derived by way of a limiting circuit which is constructed and dimensioned in such a way that a calibration voltage amplitude and calibration voltage phase results which causes self oscillation around the circuit.

5 Claims, 2 Drawing Figures

CALIBRATABLE HETERODYNE RECEIVER

BACKGROUND OF THE INVENTION

1. Field of the Invention

This invention generally relates to heterodyne receivers, and is more particularly concerned with a calibratable heterodyne receiver which can be adjusted to a calibration mark or equivalent indicia of an indicating or recording device connected to the output of the receiver during feeding of a calibration alternating current and adjustment of amplifier gain. The calibration alternating current frequency which is adapted each time to the tuning frequency is obtained by modulating the output voltage of a heterodyne oscillator of the receiver with an auxiliary voltage at a frequency which corresponds to the intermediate frequency.

2. Description of the Prior Art

An arrangement which operates according to this general principle for calibrating a selective transmission level meter is known from the German DT-AS 1,240,989. Such heterodyne receivers, which are supplied with their own auxiliary voltage generator for the purpose of calibration, have the disadvantage that every deviation of the frequency of the auxiliary voltage from the desired value, which is larger than half of the bandwidth of the pass band of the intermediate frequency band pass filter of the receiver leads to a shifting of the converted frequency of the calibration alternating current into the step band of the intermediate frequency band pass filter, and accordingly causes faulty calibration. A frequency deviation of this magnitude can occur at any time, particularly with highly selective heterodyne receivers due to the occurrence of drift in the auxiliary voltage generator.

SUMMARY OF THE INVENTION

The object of the present invention is to correct the aformentioned disadvantage of a heterodyne receiver of the type mentioned above.

According to the invention the foregoing object is achieved in that the auxiliary voltage is tapped from an intermediate frequency stage of the receiver and is derived by way of a limiting circuit which is constructed and dimensioned in such a way that a calibration voltage amplitude and calibration voltage phase results which effects self oscillation in the receiver.

The advantages which can be achieved in practicing the invention reside particularly in that the calibration frequency is always located within the pass band of the intermediate frequency band pass filter because of the exploitation of the self oscillation caused by the coupling back of the selective receiver intermediate frequency stages in producing the calibration voltage, while, on the other hand, any changes of the characteristic values of the receiver elements arranged outside of the limiting circuit which are due to aging conditions and furthermore any fluctuations of the operating valve will have no influence on the accuracy of the calibration.

BRIEF DESCRIPTION OF THE DRAWINGS

Other objects, features and advantages of the invention, its organization, construction and operation will be best understood from the following detailed description of a preferred embodiment of the invention taken in conjunction with the accompanying drawing, on which.

Figure 1:
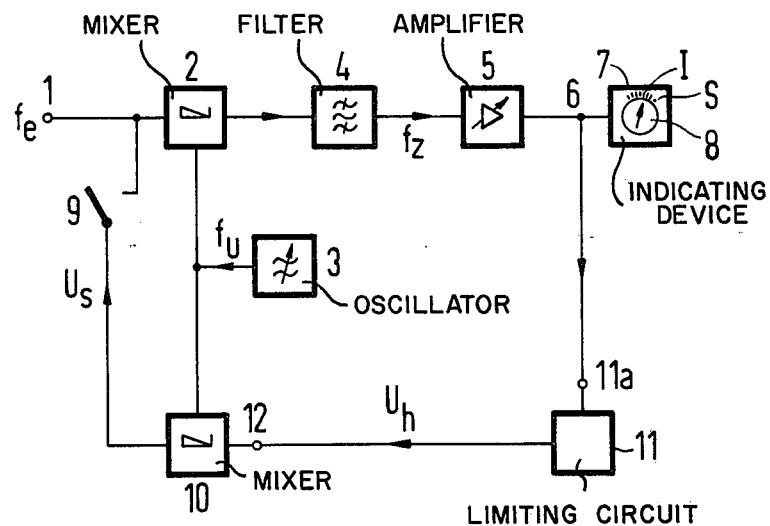
FIG. 1 is a schematic block representation of a heterodyne receiver constructed in accordance with the principles of the present invention.

Referring to the drawing, a heterodyne receiver is illustrated in FIG. 1 as having an input 1, a mixer 2 in which the received signals are converted to an intermediate frequency position by means of the output voltage of a heterodyne oscillator 3, an intermediate frequency band filter 4 which selects the intermediate frequency and which determines the transmission bandwidth of the converted signals, and an intermediate frequency amplifier 5 having an output 6 by which the signals are connected to an indicating evaluating or recording device 7. The heterodyne frequency $f_u$, which can be adjusted at the heterodyne oscillator 3, meets the conditions $f_z = f_u - f_e$ or $f_z = f_e - f_u$ in a well known manner together with the receiving frequency $f_e$ and the center frequency $f_z$ of the intermediate frequency band filter 4.

The device 7, which may be constructed for example as a voltage meter or transmission level meter, and which may include detector circuit, has digital or analogue indicating means or recording means and is provided with a calibration mark S. During a calibration process, wherein a prescribed calibration alternating current $U_s$ is directed to the input side of the receiver after closing of the switch 9, it is determined whether the actual value I, which is indicated or recorded respectively at the device 7, and which is derived in any manner from the voltage which occurs at the output 6, deviates from the desired value which is defined by the calibration mark S. If such is the case, adjusting means of the heterodyne receiver are operated by hand, or automatically because of practical reasons, to change the gain of the amplifier 5 to an extent to attain an indication of calibration at the mark S. Instead of a calibration mark, a calibration number can naturally be used which is provided during a digital evaluation, for example a digital comparator.

In order to adjust the frequency of the calibration alternating current $U_s$ to the respective tuning frequency $f_e$, the voltage $U_s$ is obtained as a modulation product in a mixer 10 which is supplied with the output voltage of the heterodyne oscillator 3 and with an auxiliary voltage $U_h$ at the frequency $f_z$. According to the presence of the first or the second of the above mentioned conditions, either the differential frequency is thereby selected or the summation frequency from the frequency $f_u$ and $f_z$.

According to the invention, the auxiliary voltage $U_h$ is tapped off from the output 6 of the intermediate frequency amplifier 5 or from another intermediate frequency stage and is directed to the mixer 10 by way of a limiting circuit 11. The limiting circuit 11 is constructed and dimensioned in such a way that the limited auxiliary voltage $U_h$ which is directed to the input 12 of the mixer 10 has such an amplitude and phase that upon closing of the switch 9 self-oscillation occurs in the circuit including the components 2, 4, 5, 6, 11, 12, 10 and 9, and that the amplitude of the voltage which occurs at the output 6 effects an adjustment of the indicating means 7 to the calibration mark S upon the initial adjustment of the circuit characteristic values of the receiver to the respective desired value. Every subsequent change of the circuit characteristic values of the receiver can be recalibrated by means of the above described operation of the adjusting means. The accuracy of the subsequent calibration depends primarily on the constancy of the values of the limiting circuit.

Figure 2:
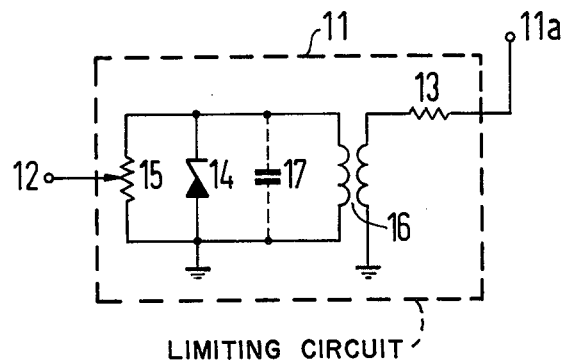
FIG. 2 is a schematic circuit diagram of a limiting circuit which may be advantageously employed in the apparatus illustrated in FIG. 1.

The limiting circuit illustrated in FIG. 2 is carried out with particular advantage by means of a voltage divider 13, 14 including a voltage divider resistor 14 which is located at the output side of the limiter circuit and comprises a breakdown diode whose characteristic curve guarantees a constant limitation at the value of the breakdown voltage. It is therefore practical to connect the output 12 of the limiting circuit 11 in series with a ohmic voltage divider resistor, preferably a variable resistor 15 in order to adapt the characteristic curve of the breakdown diode 14 to the desired amplitude value of the limited auxiliary voltage $U_h$.

In order to maintain the phase condition for self oscillation, the insertion of a coupling transformer 16 may be required, the transformer being tuned to the intermediate frequency $f_z$ if necessary by means of a capacitor 17.

Many changes and modifications of my invention may become apparent to those skilled in the art without departing from the spirit and scope of the invention. I therefore intend to include within the patent warranted hereon all such changes and modifications as may reasonably and properly be included within the scope of my contribution to the art.

I claim:

1. An amplitude calibratable heterodyne receiver comprising: a first mixer having first and second inputs and an output for providing an intermediate frequency in response to an incoming frequency received at the first input of the mixer, a band pass filter connected to the output of said first mixer, amplifier means connected to said band pass filter, an indication device having a calibration indicia connected to the output of said amplifier means, a heterodyne oscillator producing a heterodyne frequency connected to said second input of said first mixer, a second mixer having first and second inputs and an output, said second input of said second mixer connected to said heterodyne oscillator, a limiting circuit connected between the output of said amplifier means and said first input of said second mixer for deriving an auxiliary voltage, and means for connecting the output of said second mixer to the first input of said first mixer to provide a signal at a phase which effects self oscillation around the circuit including said first and second mixers, said band pass filter and said amplifier means, said amplifier means having means for adjusting the gain thereof so that the output of said amplifier means causes said indicating device to indicate calibration on said calibration indicia.

2. The receiver according to claim 1, wherein said limiting circuit comprises a voltage divider including a breakdown diode.

3. The receiver according to claim 2, wherein said limiting circuit comprises a variable ohmic voltage divider resistor.

4. The receiver according to claim 2, wherein said auxiliary voltage is derived in said limiting circuit by way of a transformer.

5. A calibratable heterodyne receiver comprising: a first mixer having first and second inputs and an output for providing an intermediate frequency in response to a received frequency at said first input, a band pass filter connected to the output of said first mixer, amplifier means connected to said band pass filter, an indicator device having a calibration indicia connected to the output of said amplifier means, a heterodyne oscillator producing a heterodyne frequency connected to said second input of said first mixer, a second mixer having first and second inputs and an output, said second input connected to said heterodyne oscillator, a limiting circuit connected between the output of said amplifier means and said first input of said second mixer for deriving an auxiliary voltage and including a first resistor connected to the output of said amplifier means, a transformer having a primary winding connected to said first resistor and a secondary winding, a capacitor connected across said secondary winding thereby forming a resonant circuit having a resonant frequency which is identical with said intermediate frequency, a breakdown diode connected across said secondary winding, and a variable resistor connected across said secondary winding and having a movable tap connected to said first input of said second mixer, and switch means operable to connect the output of said second mixer to the first input of said first mixer to provide a signal at a phase which effects self oscillation around the circuit including said first and second mixers, said band pass filter and said amplifier means, said amplifier means having means for adjusting the gain thereof so that the output of said amplifier means causes said indicating device to indicate calibration on said calibration indicia.

* * * * *